(12) United States Patent
Kaseya

(10) Patent No.: US 8,746,899 B2
(45) Date of Patent: *Jun. 10, 2014

(54) LIGHT EMITTING APPARATUS, ILLUMINATOR, AND PROJECTOR

(71) Applicant: Seiko Epson Corporation, Tokyo (JP)

(72) Inventor: Hiroyasu Kaseya, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/923,600

(22) Filed: Jun. 21, 2013

(65) Prior Publication Data

US 2013/0278901 A1 Oct. 24, 2013

Related U.S. Application Data

(63) Continuation of application No. 13/084,785, filed on Apr. 12, 2011, now Pat. No. 8,491,134.

(30) Foreign Application Priority Data

Jul. 14, 2010 (JP) ................... 2010-159504

(51) Int. Cl.
*G03B 21/14* (2006.01)
*G02B 6/32* (2006.01)
*G02B 6/00* (2006.01)
*G03H 1/00* (2006.01)
*F21V 7/04* (2006.01)
*H01L 33/00* (2010.01)

(52) U.S. Cl.
USPC ............. 353/99; 353/20; 385/34; 385/133; 359/34; 362/612; 362/555

(58) Field of Classification Search
USPC ............. 353/20, 98–99; 385/34, 133; 359/34; 362/612, 555
See application file for complete search history.

(56) References Cited

U.S. PATENT DOCUMENTS

| 5,606,181 | A | 2/1997 | Sakuma et al. | |
|---|---|---|---|---|
| 8,491,134 | B2 * | 7/2013 | Kaseya | 353/99 |
| 2007/0237456 | A1 | 10/2007 | Blauvelt et al. | |
| 2008/0278460 | A1 | 11/2008 | Arnett et al. | |
| 2011/0063585 | A1 | 3/2011 | Kaneko et al. | |
| 2011/0096134 | A1 | 4/2011 | Kang et al. | |
| 2013/0278901 | A1 * | 10/2013 | Kaseya | 353/30 |

FOREIGN PATENT DOCUMENTS

JP 2009-246407 A 10/2009

* cited by examiner

*Primary Examiner* — Georgia Y Epps
*Assistant Examiner* — Magda Cruz
(74) *Attorney, Agent, or Firm* — Harness, Dickey & Pierce, P.L.C.

(57) ABSTRACT

A light emitting apparatus includes a first rod integrator and a second rod integrator supported by a support substrate and a light emitting device disposed between the first rod integrator and the second rod integrator. The light emitting device emits a plurality of light beams to be incident on the first rod integrator and a plurality of light beams to be incident on the second rod integrator. Each of the rod integrators has a light incident surface on which the plurality of light beams are incident, a bent portion that changes the propagating direction of the plurality of incident light beams, and a light exiting surface through which the plurality of light beams mixed with each other exit.

8 Claims, 6 Drawing Sheets

United States Patent US 8,746,899 B2

LIGHT EMITTING APPARATUS, ILLUMINATOR, AND PROJECTOR

CROSS-REFERENCE TO RELATED APPLICATIONS

This is a continuation patent application of U.S. application Ser. No. 13/084,785 filed Apr. 12, 2011 which claims priority to Japanese Patent Application No. 2010-159504, filed Jul. 14, 2010 all of which are expressly incorporated by reference herein in their entireties.

BACKGROUND

1. Technical Field

The present invention relates to a light emitting apparatus, an illuminator, and a projector.

2. Related Art

In a light emitting apparatus including a light emitting device formed of a chip and emitting light beams through both end surfaces of the chip, a mirror is, for example, used in some cases to direct the light beams emitted through both end surfaces in the same direction. As an example of the light emitting apparatus in which a mirror is used to change the traveling direction of the light beams, JP-A-2009-246407, for example, discloses a configuration in which two reflection surfaces inclined to the horizontal direction by 45 degrees are provided on a support member by which a light emitting device that emits light beams through both end surfaces in the horizontal direction is supported so that the light beams emitted through both end surfaces travel in the same direction. That is, in the example described in JP-A-2009-246407, the two reflection surfaces provided on the support member function as mirrors for changing the traveling direction of the light beams.

In a light emitting device of this type, each of the end surfaces of the chip has in some cases a plurality of light emitting surfaces in order to increase the output of the light emitting device. In a light emitting device having a plurality of light emitting surfaces, the intensities of light beams emitted through the light emitting surfaces may differ from one another in some cases. When the light emitting device in which each of the end surfaces has a plurality of light emitting surfaces is used with the reflection surfaces inclined by 45 degrees to direct the light beams emitted through the light emitting surfaces in the same direction as described in JP-A-2009-246407, an area illuminated with the light beams disadvantageously has a non-uniform optical intensity distribution because the intensities of the light beams emitted through the light emitting surfaces differ from one another.

SUMMARY

An advantage of some aspects of the invention is to provide a light emitting apparatus capable of producing a single optical intensity distribution in an illuminated area.

Another advantage of some aspects of the invention is to provide an illuminator including the light emitting apparatus.

Still another advantage of some aspects of the invention is to provide a projector including the illuminator.

A light emitting apparatus according to a first aspect of the invention includes a support substrate, a first rod integrator and a second rod integrator supported by the support substrate, and a light emitting device supported by the support substrate and disposed between the first rod integrator and the second rod integrator. The light emitting device emits first light and second light to be incident on the first rod integrator and third light and fourth light to be incident on the second rod integrator. The first rod integrator has a first light incident surface on which the first light and the second light are incident, a first bent portion that changes the propagating direction of the first light and the second light, and a first light exiting surface through which the first light and the second light mixed with each other exit toward a predetermined area. The second rod integrator has a second light incident surface on which the third light and the fourth light are incident, a second bent portion that changes the propagating direction of the third light and the fourth light, and a second light exiting surface through which the third light and the fourth light mixed with each other exit toward the predetermined area.

According to the light emitting apparatus described above, the first rod integrator can mix the first light and the second light emitted from the light emitting device and direct the mixed light toward the predetermined area, and the second rod integrator can mix the third light and the fourth light emitted from the light emitting device and direct the mixed light toward the predetermined area. The light emitting apparatus can therefore produce a uniform optical intensity distribution in an illuminated area.

Further, using rod integrators eliminates a need for precise centering, unlike a case where any other optical system for producing a uniform optical intensity distribution in an illuminated area.

The light emitting apparatus according to the first aspect of the invention may further include a first cylindrical lens disposed in the optical paths of the first light and the second light and a second cylindrical lens disposed in the optical paths of the third light and the fourth light.

According to the light emitting apparatus described above, since the angle of radiation of the light incident on the first rod integrator can be reduced, the angle of radiation of the light that exits from the first rod integrator can be reduced. Similarly, since the angle of radiation of the light incident on the second rod integrator can be reduced, the angle of radiation of the light that exits from the second rod integrator can be reduced.

The light emitting apparatus according to the first aspect of the invention may further include a first cylindrical lens disposed in the optical path of the light having exited through the first light exiting surface and a second cylindrical lens disposed in the optical path of the light having exited through the second light exiting surface.

According to the light emitting apparatus described above, the angle of radiation of the light that exits from the first rod integrator and the angle of radiation of the light that exits from the second rod integrator can be reduced.

The light emitting apparatus according to the first aspect of the invention may further include a first polarization converter that converts the light having exited through the first light exiting surface into first polarized light and a second polarization converter that converts the light having exited through the second light exiting surface into second polarized light, and the first polarized light and the second polarized light may be polarized in the same direction.

According to the light emitting apparatus described above, the illuminated area can be illuminated with polarized light.

In the light emitting apparatus according to the first aspect of the invention, the light emitting device may be a super luminescent diode.

When the light emitting apparatus described above is used as a light source in an image projection apparatus, such as a projector, or an image display apparatus, the amount of speckle noise can be reduced.

In the light emitting apparatus according to the first aspect of the invention, the first light exiting surface and the second light exiting surface may be oriented in the same direction.

According to the light emitting apparatus described above, the light that exits from the first rod integrator and the light that exits from the second rod integrator can travel in the same direction.

An illuminator according to a second aspect of the invention includes the light emitting apparatus according to the first aspect of the invention, a first lens that causes the light having exited through the first light exiting surface of the first rod integrator in the light emitting apparatus to diverge, a second lens that causes the light having exited through the second light exiting surface of the second rod integrator in the light emitting apparatus to diverge, a third lens that superimposes the light having exited through the first lens over the light having exited through the second lens, and a fourth lens that causes the light superimposed by the third lens to converge.

The illuminator described above, which includes the light emitting apparatus according to the first aspect of the invention, can produce a uniform optical intensity distribution in the illuminated area. Further, since the third lens can superimpose the light fluxes having exited through the two light exiting surfaces over each other, the optical intensity distribution in the illuminated area can be more uniform.

A projector according to a third aspect of the invention includes the illuminator according to the second aspect of the invention, a light modulation apparatus that modulates the light having exited from the illuminator in accordance with image information, and a projection apparatus that projects an image formed by the light modulation apparatus.

The projector described above, which includes the illuminator according to the second aspect of the invention, can project an image having only a small amount of illuminance unevenness.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the invention will be described below with reference to the drawings.

1. Light Emitting Apparatus

Figure 1:
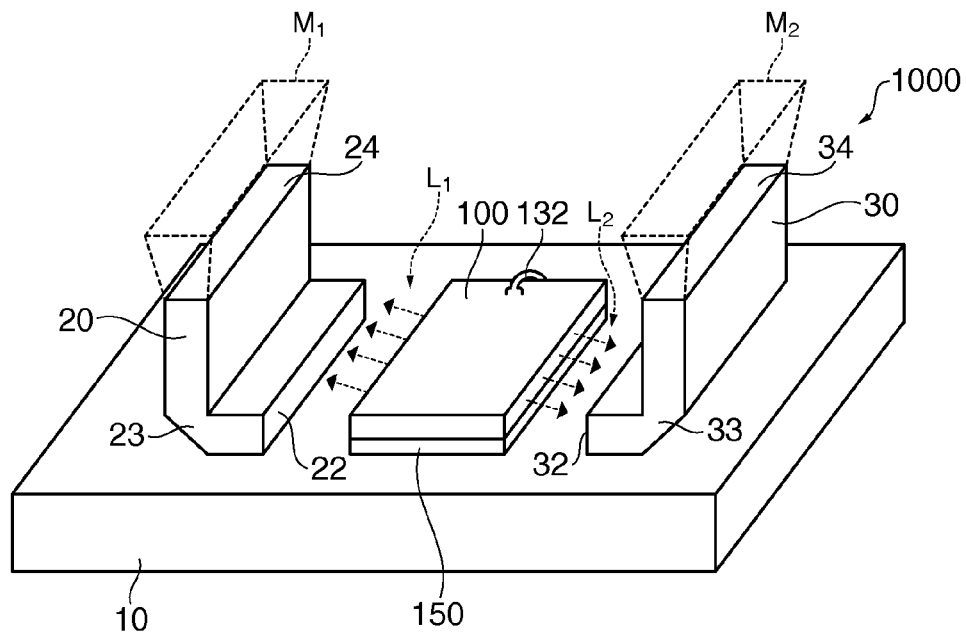
FIG. 1 is a perspective view diagrammatically showing a light emitting apparatus according to an embodiment.
Figure 2:
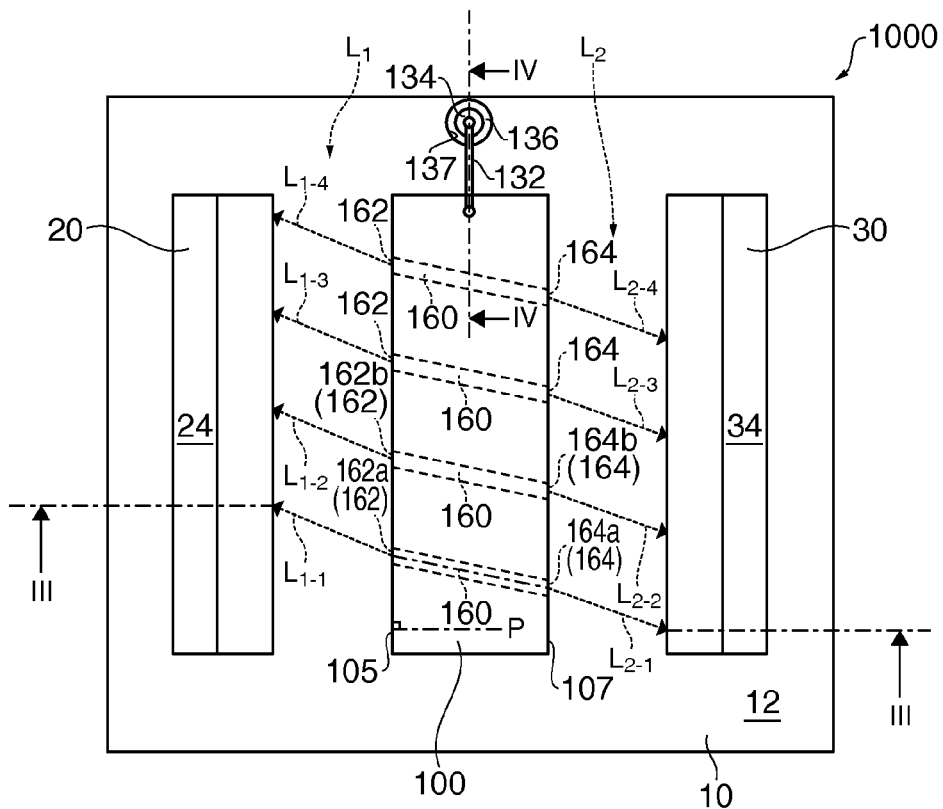
FIG. 2 is a plan view diagrammatically showing the light emitting apparatus according to the embodiment.
Figure 3:
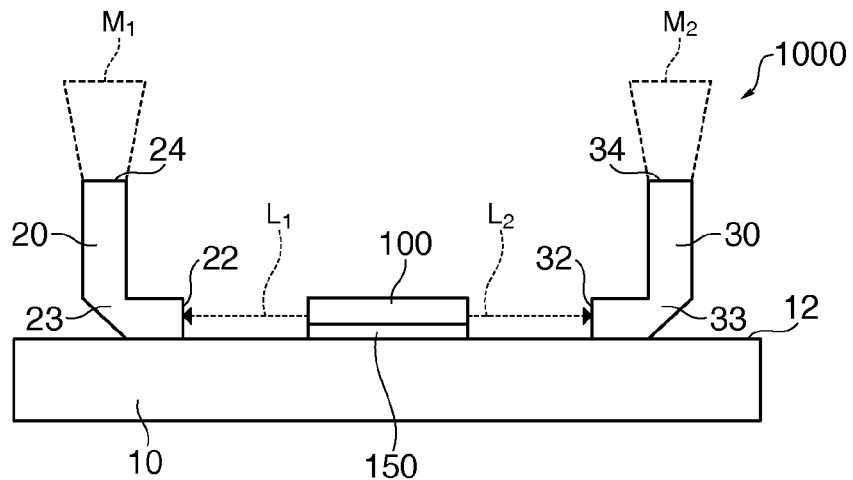
FIG. 3 is a cross-section view diagrammatically showing the light emitting apparatus according to the embodiment.
Figure 4:
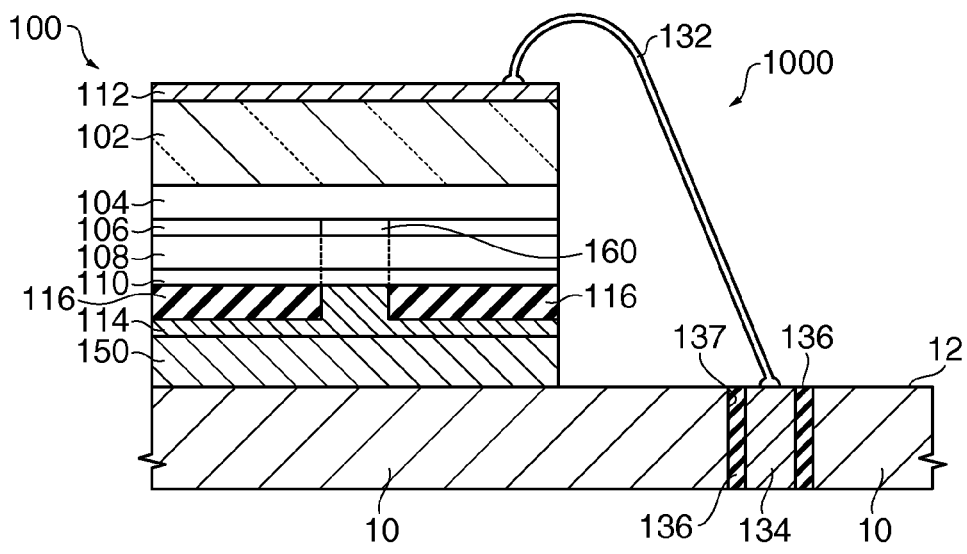
FIG. 4 is another cross-section view diagrammatically showing the light emitting apparatus according to the embodiment.

A light emitting apparatus 1000 according to the present embodiment will first be described with reference to the drawings. FIG. 1 is a perspective view diagrammatically showing the light emitting apparatus 1000. FIG. 2 is a plan view diagrammatically showing the light emitting apparatus 1000. FIGS. 3 and 4 are cross-sectional views diagrammatically showing the light emitting apparatus 1000. FIG. 3 is a cross-sectional view taken along the line in FIG. 2, and FIG. 4 is a cross-sectional view taken along the line IV-IV in FIG. 2. In FIGS. 1 and 3, a light emitting device 100 is shown in a simplified form for ease of illustration.

The light emitting apparatus 1000 includes a support substrate 10, a first rod integrator 20, a second rod integrator 30, and a light emitting device 100, as shown in FIGS. 1 to 4. The light emitting apparatus 1000 can further include a sub-mount 150. In the present embodiment, a description will be made of a case where the light emitting device 100 is a super luminescent diode (hereinafter also referred to as an "SLD") made of an InGaAlP-based material (red light emission). An SLD can prevent laser oscillation because an end surface reflection resonator is not formed, unlike a semiconductor laser. The amount of speckle noise can therefore be reduced when the light emitting apparatus 1000 using an SLD is used as a light source in an image projection apparatus, such as a projector, or an image display apparatus.

The support substrate 10 can support the light emitting device 100 indirectly via the sub-mount 150. The support substrate 10 may alternatively support the light emitting device 100 directly without the sub-mount 150. The support substrate 10 can further support the first rod integrator 20 and the second rod integrator 30. The support substrate 10 can, for example, be a plate-shaped member (box-shaped member).

The sub-mount 150 is supported by the support substrate 10. The sub-mount 150 can, for example, be a plate-shaped member. The sub-mount 150 can directly support the light emitting device 100.

The thermal conductivity of the support substrate 10 is higher than that of the sub-mount 150, and the thermal conductivity of the sub-mount 150 is higher than that of the light emitting device 100. The thermal conductivity of each of the support substrate 10 and the sub-mount 150 is, for example, at least 140 W/mK. The coefficient of thermal expansion of the sub-mount 150 is desirably close to that of the light emitting device 100. The reliability of the light emitting device 100 can be improved by using the sub-mount 150 to reduce the magnitude of stress induced by the difference in the coefficient of thermal expansion between the support substrate 10 and the light emitting device 100. The support substrate 10 is made, for example, of any of Cu, Al, Mo, W, Si, C, Be, Au, a compound thereof (AlN and BeO, for example), and an alloy thereof (CuMo, for example). The support substrate 10 may alternatively be made of a combination of those described above, such as a multilayer structure formed of a copper (Cu) layer and a molybdenum (Mo) layer. The sub-mount 150 is made, for example, of a layer made of any of AlN, CuW, SiC, BeO, CuMo, and a multilayer structure formed of copper (Cu) and a molybdenum (Mo) layer (CMC).

A cylindrical through hole 137 is formed through the support substrate 10, as shown in FIGS. 2 and 4. A cylindrical terminal 134, the side surface of which is covered with an insulating member 136, is provided in the through hole 137. The insulating member 136 is made, for example, of a resin or a ceramic (AlN, for example). The terminal 134 is made, for example, of copper (Cu).

A connection member 132, such as a wire bonding line, connects the terminal 134 to a second electrode 112 of the light emitting device 100. The connection member 132 is so disposed that it does not interfere with the optical paths of emitted light beams $L_1$ ($L_{1-1}$ to $L_{1-4}$) and $L_2$ ($L_{2-1}$ to $L_{2-4}$). A first electrode 114 of the light emitting device 100 is connected to the sub-mount 150, for example, via plated bumps (not shown). The sub-mount 150 is connected to the support substrate 10. A voltage can be applied between the first electrode 114 and the second electrode 112 by producing a potential difference between the terminal 134 and the support substrate 10.

The light emitting device 100 is supported by the support substrate 10 via the sub-mount 150. The light emitting device 100 is disposed between the first rod integrator 20 and the second rod integrator 30.

The light emitting device 100 includes a cladding layer (hereinafter referred to as a "first cladding layer") 108, an active layer 106 formed thereon, and a cladding layer (hereinafter referred to as a "second cladding layer") 104 formed thereon, as shown in FIG. 4. The light emitting device 100 can further include a substrate 102, a contact layer 110, an electrode (hereinafter referred to as a "first electrode") 114, another electrode (hereinafter referred to as a "second electrode") 112, and an insulator 116.

The substrate 102 can, for example, be a GaAs substrate of a first conductive type (n-type, for example).

The second cladding layer 104 is formed under the substrate 102. The second cladding layer 104 can, for example, be an n-type AlGaInP layer. Although not shown, a buffer layer may be formed between the substrate 102 and the second cladding layer 104. The buffer layer can, for example, be an n-type GaAs or InGaP layer.

The active layer 106 is formed under the second cladding layer 104. The active layer 106 is disposed in the light emitting device 100, for example, on the side close to the support substrate 10. The active layer 106 is sandwiched between the second cladding layer 104 and the first cladding layer 108. The active layer 106 has, for example, a multiple quantum well (MQW) structure in which three quantum well structures each of which is formed of an InGaP well layer and an InGaAlP barrier layer are stacked.

The active layer 106 has, for example, a box-like shape (including a cubic shape). The active layer 106 has a first surface 105 facing the first rod integrator 20 and a second surface 107 facing the second rod integrator 30, as shown in FIG. 2. The first surface 105 and the second surface 107 face away from each other and parallel to each other in the example shown in FIG. 2. Among the surfaces of the active layer 106, the first surface 105 and the second surface 107 are those that are not in contact with the second cladding layer 104 or the first cladding layer 108. It can be said that the first surface 105 and the second surface 107 are side surfaces of the active layer 106.

Part of the active layer 106 forms a gain region 160, which serves as a current path in the active layer 106. The gain region 160 can produce light, which can be amplified in the gain region 160. The shape of the gain region 160 in a plan view is, for example, a parallelogram. The gain region 160 is formed of a plurality of gain regions, as shown in FIG. 2. In this way, the output from the light emitting device 100 can be increased. Each of the gain regions 160 is provided linearly from the first surface 105 to the second surface 107 in a direction inclined to a normal P to the first surface 105. The configuration of each of the gain regions 160 suppresses or prevents laser oscillation of the light produced therein.

Although not shown, each of the gain regions 160 may alternatively be provided linearly from the first surface 105 to the second surface 107 and in parallel with the normal P to the first surface 105. In this case, a resonator is formed and laser light can be produced. That is, the light emitting device 100 may, for example, be a semiconductor laser.

Each of the gain regions 160 has a light emitting surface 162 provided as part of the first surface 105 and a light emitting surface 164 provided as part of the second surface 107. At least two light emitting surfaces (first light emitting surface 162a and second light emitting surface 162b) are provided as part of the first surface 105, and at least two light emitting surfaces (third light emitting surface 164a and fourth light emitting surface 164b) are provided as part of the second surface 107. In the illustrated example, in which four gain regions 160 are provided, four light emitting surfaces 162 and 164 are provided as part of the first surface 105 and the second surface 107.

The first cladding layer 108 is formed under the active layer 106, as shown in FIG. 4. The first cladding layer 108 can, for example, be an AlGaInP layer of a second conductivity type (p type, for example).

For example, the p-type first cladding layer 108, the active layer 106, to which no impurity has been doped, and the n-type second cladding layer 104 form a pin diode. Each of the first cladding layer 108 and the second cladding layer 104 is a layer having a wider band gap and a smaller refractive index than those of the active layer 106. The active layer 106 has a function of light amplification. The first cladding layer 108 and the second cladding layer 104, which sandwich the active layer 106, have a function of trapping injected carriers (electrons and holes) and light.

The contact layer 110 is formed under the first cladding layer 108. The contact layer 110 can be a layer that allows ohmic contact with the first electrode 114. The contact layer 110 is made, for example, of a semiconductor material of the second conductivity type. The contact layer 110 can, for example, be a p-type GaAs layer.

The insulator 116 is formed under the contact layer 110 except the portions below the gain regions 160. That is, the insulator 116 has openings located below the gain regions 160, and the openings expose the corresponding surfaces of the contact layer 110. The insulator 116 can, for example, be a SiN layer, a $SiO_2$ layer, or a polyimide layer.

The first electrode 114 is formed under the exposed portion of the contact layer 110 and the insulator 116. The first electrode 114 is electrically connected to the first cladding layer 108 via the contact layer 110. The first electrode 114 is one of the electrodes for driving the light emitting device 100. The first electrode 114 can, for example, be a Cr layer, a AuZn layer, and a Au layer stacked in this order on the contact layer 110. The surface where the first electrode 114 is in contact with the contact layer 110 has, for example, the same shape in a plan view as the shape of the corresponding gain region 160. In the illustrated example, the plan shape of the surface in which the first electrode 114 is in contact with the contact layer 110 determines the current path between the electrodes 112 and 114 and hence the plan shape of the corresponding gain region 160.

The second electrode 112 is formed over the entire surface of the substrate 102. The second electrode 112 can be in contact with a layer that allows ohmic contact with the second electrode 112 (the substrate 102 in the illustrated example). The second electrode 112 is electrically connected to the second cladding layer 104 via the substrate 102. The second electrode 112 is the other one of the electrodes for driving the light emitting device 100. The second electrode 112 can, for example, be a Cr layer, a AuGe layer, a Ni layer, and a Au layer stacked in this order on the substrate 102. A second contact layer (not shown) can further be provided between the second cladding layer 104 and the substrate 102. In this case, the portion of the second contact layer that faces the second cladding layer 104 is exposed, for example, in a dry etching process, and the second electrode 112 is provided under the second contact layer. A single-sided electrode structure can thus be produced. The second contact layer can, for example, be an n-type GaAs layer.

In the light emitting device 100, when a forward bias voltage at which the pin diode is activated is applied between the first electrode 114 and the second electrode 112, electrons are recombined with holes in the gain regions 160 of the active layer 106. The recombination leads to light emission. The produced light triggers stimulated emission in a chain reaction, and the light travels through the gain regions 160, and the intensity of the light is amplified therein. The emitted light beams $L_1$ ($L_{1-1}$ to $L_{1-4}$) are emitted through the light emitting surfaces 162, and the emitted light beams $L_2$ ($L_{2-1}$ to $L_{2-4}$) are emitted through the light emitting surfaces 164. The emitted light beams $L_1$ and $L_2$ are emitted in a direction inclined to the normal P to the first surface 105 by a greater amount than the gain region 160 is inclined to the normal P, for example, due to optical refraction. The emitted light beams $L_1$ and $L_2$ travel, for example, in the direction parallel to an upper surface 12 of the support substrate 10 (horizontal direction). The emitted light beams $L_1$ and $L_2$ travel in opposite directions.

The first rod integrator 20 is supported by the support substrate 10. The first rod integrator 20 has a first light incident surface 22, a first bent portion 23, and a first light exiting surface 24, as shown in FIGS. 1 and 3. The first rod integrator 20 is, for example, a column-shaped prism made of glass and having a rectangular cross-sectional shape. The first rod integrator 20 may alternatively be a hollow rod obtained by combining glass plates each having a reflective coating in such a way that the reflection surfaces face inward and the resultant structure has a rectangular cross-sectional shape.

On the first light incident surface 22 of the first rod integrator 20 are incident at least the emitted light beam (first light beam) $L_{1-1}$ emitted through the first light emitting surface 162a and the emitted light beam (second light beam) $L_{1-2}$ emitted through the second light emitting surface 162b. The emitted light beams $L_{1-1}$ and $L_{1-2}$ having been incident on the first light incident surface 22 repeatedly undergo total reflection off the inner surface of the first rod integrator 20, and the resultant mixed light flux has a uniform optical intensity distribution and exits through the first light exiting surface 24. In the illustrated example, the emitted light beams $L_{1-1}$ to $L_{1-4}$ are incident on the first light incident surface 22. The emitted light beams $L_{1-1}$ to $L_{1-4}$ having been incident on the first light incident surface 22 repeatedly undergo total reflection off the inner surface of the first rod integrator 20, and the resultant mixed light flux has a single optical intensity and exits through the first light exiting surface 24.

The first rod integrator 20 has the first bent portion 23, as shown in FIGS. 1 and 3. The first bent portion 23 can change the propagating direction of the light in the first rod integrator 20. In the illustrated example, the first rod integrator 20 is bent by 90 degrees at the first bent portion 23. As a result, the direction in which the first light incident surface 22 is oriented (the direction of a normal to the first light incident surface 22) forms an angle of 90 degrees with the direction in which the first light exiting surface 24 is oriented (the direction of a normal to the first light exiting surface 24). Therefore, the emitted light beams $L_1$ emitted through the light emitting surfaces 162 of the light emitting device 100 and traveling in the horizontal direction are deflected in the first rod integrator 20 and exit as a mixed light flux $M_1$ that travels in the vertical direction (the direction of a normal to the upper surface 12 of the support substrate 10).

The second rod integrator 30 is supported by the support substrate 10. The second rod integrator 30 has a second light incident surface 32, a second bent portion 33, and a second light exiting surface 34, as shown in FIG. 3. The second rod integrator 30 is, for example, a column-shaped prism made of glass and having a rectangular cross-sectional shape. The second rod integrator 30 may alternatively be a hollow rod obtained by combining glass plates each having a reflective coating in such a way that the reflection surfaces face inward and the resultant structure has a rectangular cross-sectional shape.

On the second light incident surface 32 of the second rod integrator 30 are incident at least the emitted light beam (third light beam) $L_{2-1}$ emitted through the third light emitting surface 164a and the emitted light beam (fourth light beam) $L_{2-2}$ emitted through the fourth light emitting surface 164b. The emitted light beams $L_{2-1}$ and $L_{2-2}$ having been incident on the second light incident surface 32 repeatedly undergo total reflection off the inner surface of the second rod integrator 30, and the resultant mixed light flux has a uniform optical intensity distribution and exits through the second light exiting surface 34. In the illustrated example, the emitted light beams $L_{2-1}$ to $L_{2-4}$ are incident on the second light incident surface 32. The emitted light beams $L_{2-1}$ to $L_{2-4}$ having been incident on the second light incident surface 32 repeatedly undergo total reflection off the inner surface of the second rod integrator 30, and the resultant mixed light flux has a single optical intensity and exits through the second light exiting surface 34.

The second rod integrator 30 has the second bent portion 33, as shown in FIGS. 1 and 3. The second bent portion 33 can change the propagating direction of the light in the second rod integrator 30. In the illustrated example, the second rod integrator 30 is bent by 90 degrees at the second bent portion 33. As a result, the direction in which the second light incident surface 32 is oriented (the direction of a normal to the second light incident surface 32) forms an angle of 90 degrees with the direction in which the second light exiting surface 34 is oriented (the direction of a normal to the second light exiting surface 34). Therefore, the emitted light beams $L_2$ emitted through the light emitting surfaces 164 of the light emitting device 100 and traveling in the horizontal direction are deflected in the second rod integrator 30 and exit as a mixed light flux $M_2$ that travels in the vertical direction.

The mixed light fluxes $M_1$ and $M_2$ exit through the first light exiting surface 24 of the first rod integrator 20 and the second light exiting surface 34 of the second rod integrator 30, respectively, toward a predetermined area (illuminated area). It is noted that a case where light exits through a light exiting surface toward a predetermined area includes a case where light exits through a light exiting surface directly toward a predetermined area and a case where light exits through a light exiting surface toward a predetermined area via an optical system (not shown). The illuminated area can, for example, be a light incident surface of a light valve when the light emitting apparatus 1000 is used as a light source in a projector. The first light exiting surface 24 of the first rod integrator 20 and the second light exiting surface 34 of the second rod integrator 30 are oriented in the same direction (vertically upward with respect to the upper surface 12) in the illustrated example. That is, the mixed light flux $M_1$ that exits through the first light exiting surface 24 and the mixed light flux $M_2$ that exits through the second light exiting surface 34 travel in the same direction. The direction in which the light exiting surfaces 24 and 34 are oriented is not limited to a specific direction but may be any direction that allows the exiting light to travel toward an illuminated area. For example, the first light exiting surface 24 and the second light exiting surface 34 may be oriented in different directions.

The light emitting apparatus 1000 has been described with reference to the case where the light emitting device 100 is made of an InGaAlP-based material by way of example, but the light emitting device 100 can alternatively be made of any material that can form a region where emitted light is amplified. Exemplary useable semiconductor materials may include AlGaN-based, InGaN-based, GaAs-based, InGaAs-based, GaInNAs-based, and ZnCdSe-based semiconductor materials.

The light emitting apparatus 1000 has been described with reference to the case where the light emitting device 100 is a gain guiding type by way of example, but the light emitting device 100 may be a refractive index guiding type.

The light emitting apparatus 1000 described above can be used as a light source in a projector, a display, an illuminator, a measuring instrument, and other similar apparatus.

The light emitting apparatus 1000, for example, has the following features.

According to the light emitting apparatus 1000, the first rod integrator 20 mixes the emitted light beams $L_{1-1}$ and $L_{1-2}$ emitted from the light emitting device 100 and allows the mixed light flux to exit, and the second rod integrator 30 mixes the emitted light beams $L_{2-1}$ and $L_{2-2}$ emitted from the light emitting device 100 and allows the mixed light flux to exit. The light emitting apparatus 1000 can therefore produce a uniform optical intensity distribution in an illuminated area.

Further, the configuration using the rod integrators 20 and 30 is superior to a configuration using any other optical system for producing a uniform optical intensity distribution in an illuminated area because no precise centering is necessary, whereby the light emitting apparatus can be readily manufactured.

In the light emitting apparatus 1000, the first light exiting surface 24 of the first rod integrator 20 and the second light exiting surface 34 of the second rod integrator 30 are oriented in the same direction. The traveling direction of the mixed light flux $M_1$ can therefore be the same as that of the mixed light flux $M_2$. In this way, for example, when the light emitting apparatus 1000 is used as a light source in an image projection apparatus, such as a projector, or an image display apparatus, it is unnecessary to provide an optical system that causes the mixed light fluxes $M_1$ and $M_2$ to travel in the same direction, whereby the configuration of the optical system in the image projection apparatus or the image display apparatus can be simplified.

In the light emitting apparatus 1000, the light emitting device 100 can be an SLD. When the light emitting apparatus 1000 is used as a light source in an image projection apparatus, such as a projector, or an image display apparatus, the amount of speckle noise can therefore be reduced.

2. Method for Manufacturing Light Emitting Apparatus

Figure 5:
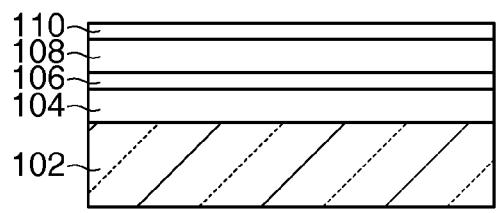
FIG. 5 is a cross-sectional view diagrammatically showing a step of manufacturing the light emitting apparatus according to the embodiment.
Figure 6:
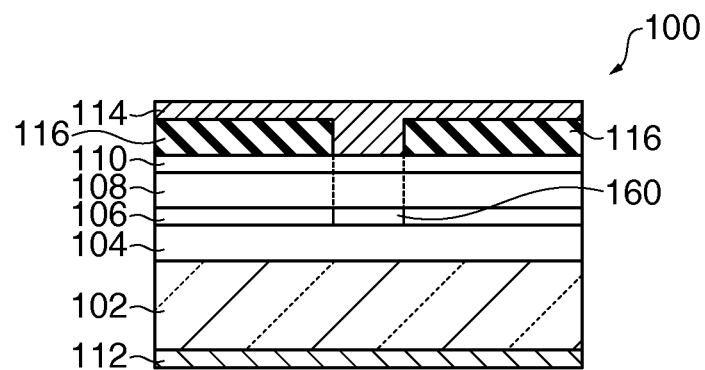
FIG. 6 is a cross-sectional view diagrammatically showing another step of manufacturing the light emitting apparatus according to the embodiment.
Figure 7:
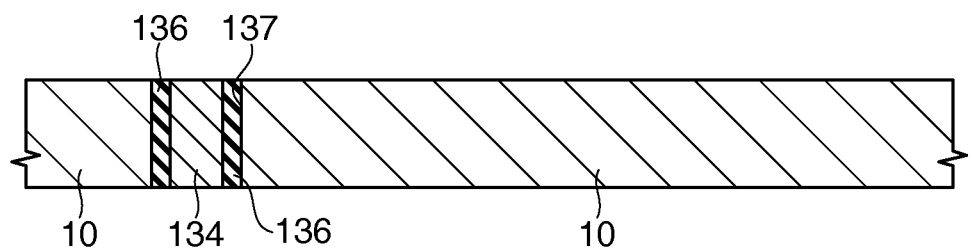
FIG. 7 is a cross-sectional view diagrammatically showing another step of manufacturing the light emitting apparatus according to the embodiment.

A method for manufacturing the light emitting apparatus 1000 according to the present embodiment will next be described with reference to the drawings. FIGS. 5 to 7 are cross-sectional views diagrammatically showing the steps of manufacturing the light emitting apparatus 1000.

As shown in FIG. 5, the second cladding layer 104, the active layer 106, the first cladding layer 108, and the contact layer 110 are formed in this order on the substrate 102 in an epitaxial growth process. Exemplary methods for performing the epitaxial growth may include MOCVD (Metal Organic Chemical Vapor Deposition) and MBE (Molecular Beam Epitaxy).

As shown in FIG. 6, the insulator 116 having openings is formed on the contact layer 110. The insulator 116 is formed, for example, by using CVD (Chemical Vapor Deposition). The openings are formed by patterning the insulator, for example, by using photolithography and etching techniques so that the corresponding portions of the contact layer 110 are exposed.

The first electrode 114 is then formed on the exposed contact layer 110 and the insulator 116. The second electrode 112 is then formed on the lower surface of the substrate 102. The first electrode 114 and the second electrode 112 are formed, for example, by using vacuum deposition. The first electrode 114 and the second electrode 112 are not necessarily formed in a particularly specific order. The light emitting device 100 can be formed by carrying out the steps described above.

As shown in FIG. 7, the through hole 137 is formed through the support substrate 10 by using a known method. The insulating member 136 is then formed to cover the inner side surface of the through hole 137 but not to entirely block the through hole 137. The insulating member 136 is deposited, for example, in a CVD process. The rod-shaped terminal 134 is then inserted into a space inside the insulating member 136. Alternatively, the insulating member 136 may be formed around the rod-shaped terminal 134, and the terminal 134 with the insulating member 136 therearound may then be inserted into the through hole 137.

As shown in FIG. 4, the light emitting device 100 is first mounted on the sub-mount 150, and the sub-mount 150 on which the light emitting device 100 has been mounted is then mounted on the support substrate 10. The light emitting device 100 is so mounted that the active layer 106 is disposed on the side close to the support substrate 10 (junction-down mounting). That is, the light emitting device 100 can be mounted in a flip-chip manner.

The terminal 134 is then connected to the second electrode 112 of the light emitting device 100 via the connecting member 132. The present step is carried out, for example, in a wire bonding process.

As shown in FIGS. 1 to 3, the rod integrators 20 and 30 are disposed on the support substrate 10. The rod integrators 20 and 30 are so disposed that the light emitting device 100 is located between the rod integrators 20 and 30. In the process in which the rod integrators 20 and 30 are disposed, the optical axes thereof are adjusted with respect to the emitted light beams $L_1$ and $L_2$. A rod integrator does not require precise centering, unlike other optical systems that produce a uniform optical intensity distribution in an illuminated area. Using the rod integrators therefore allows the manufacturing steps to be simplified. The rod integrators 20 and 30 are fixed to the support substrate 10, for example, with an adhesive.

The light emitting apparatus 1000 can be manufactured by carrying out the steps described above.

3. Variations of Light Emitting Apparatus

Light emitting apparatus according to variations of the present embodiment will next be described with reference to the drawings. In the following light emitting apparatus according to the variations of the present embodiment, members having the same functions as those of the components of the light emitting apparatus 1000 according to the present embodiment have the same reference characters, and no detailed description of those members will be made.

Figure 8:
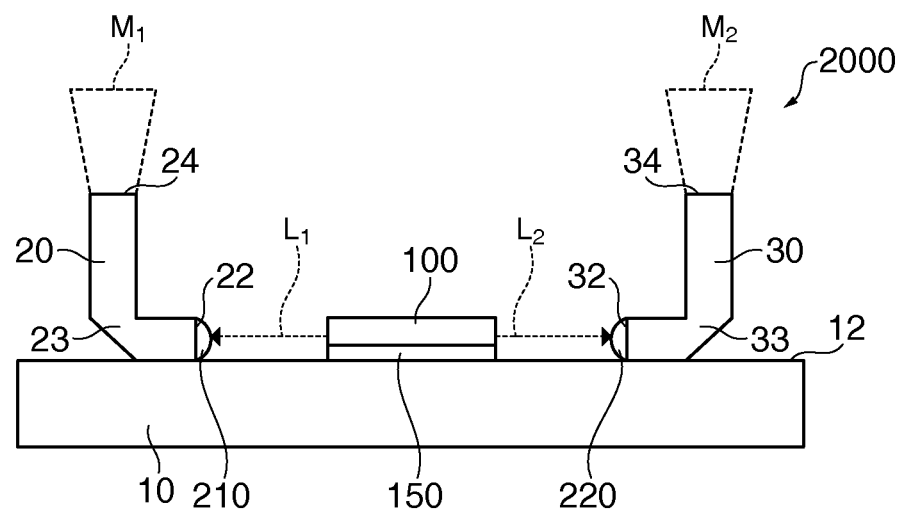
FIG. 8 is a cross-sectional view diagrammatically showing a light emitting apparatus according to a first variation of the embodiment.

3-1. A description will first be made of a light emitting apparatus 2000 according to a first variation of the present embodiment. FIG. 8 is a cross-sectional view diagrammatically showing the light emitting apparatus 2000. In FIG. 8, the light emitting device 100 is shown in a simplified form for ease of illustration.

The light emitting apparatus 2000 includes a first cylindrical lens 210 and a second cylindrical lens 220, as shown in FIG. 8. The first cylindrical lens 210 is disposed somewhere in the optical paths of the emitted light beams $L_1$ and between the light emitting device 100 and the first rod integrator 20. The second cylindrical lens 220 is disposed somewhere in the optical paths of the emitted light beams $L_2$ and between the light emitting device 100 and the second rod integrator 30. In the illustrated example, the cylindrical lenses 210 and 220 are so disposed that they are in contact with the light incident surfaces 22 and 32 of the rod integrators 20 and 30.

In general, an SLD, a semiconductor laser, or any other similar light emitting device emits light having a large angle of radiation. In particular, light emitted from an SLD, a semiconductor laser, or any other similar light emitting device has a larger angle of radiation in the thickness direction of the active layer than the angle of radiation of the emitted light in the in-plane direction. In the illustrated example, the thickness direction of the active layer 106 is the direction of a normal to the upper surface 12 of the support substrate 10, and the in-plane direction of the active layer 106 is the in-plane direction of the upper surface 12 of the support substrate 10 (see FIG. 4). In the light emitting apparatus 2000, the first cylindrical lens 210 disposed in the optical paths of the emitted light beams $L_1$ and the second cylindrical lens 220 disposed in the optical paths of the emitted light beams $L_2$ can reduce the angles of radiation of the emitted light beams $L_1$ and $L_2$ in the thickness direction of the active layer 106. The angles of radiation of the mixed light fluxes $M_1$ and $M_2$ that exit through the rod integrators 20 and 30 can therefore be reduced.

Figure 9:
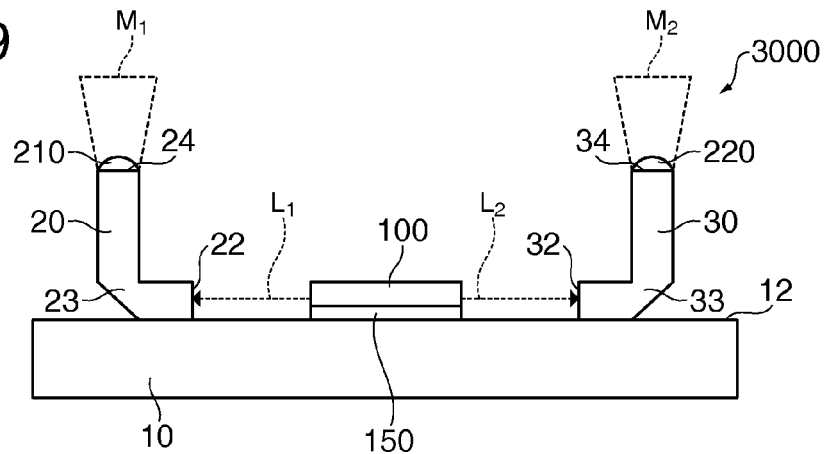
FIG. 9 is a cross-sectional view diagrammatically showing a light emitting apparatus according to a second variation of the embodiment.

3-2. A light emitting apparatus 3000 according to a second variation of the present embodiment will next be described. FIG. 9 is a cross-sectional view diagrammatically showing the light emitting apparatus 3000. In FIG. 9, the light emitting device 100 is shown in a simplified form for ease of illustration. In the following light emitting apparatus according to the second variation, members having the same functions as those of the components of the light emitting apparatus 2000 have the same reference characters, and no detailed description of those members will be made.

The light emitting apparatus 3000 includes a first cylindrical lens 210 and a second cylindrical lens 220, as shown in FIG. 9. The first cylindrical lens 210 is disposed somewhere in the optical path of the mixed light flux $M_1$ having exited through the first light exiting surface 24 of the first rod integrator 20. The second cylindrical lens 220 is disposed somewhere in the optical path of the mixed light flux $M_2$ having exited through the second light exiting surface 34 of the second rod integrator 30. In the illustrated example, the cylindrical lenses 210 and 220 are so disposed that they are in contact with the light exiting surfaces 24 and 34 of the rod integrators 20 and 30.

In the light emitting apparatus 3000, the first cylindrical lens 210 disposed in the optical path of the mixed light flux $M_1$ and the second cylindrical lens 220 disposed in the optical path of the mixed light flux $M_2$ can reduce the angles of radiation of the mixed light fluxes $M_1$ and $M_2$ having exited through the rod integrators 20 and 30. Further, in the light emitting apparatus 3000, since the light fluxes having passed through the rod integrators 20 and 30 are incident on the cylindrical lenses 210 and 220, the angles of radiation of the mixed light fluxes $M_1$ and $M_2$ can be reduced without reduction in the angle of incidence of the light incident on the rod integrators 20 and 30. Therefore, in the light emitting apparatus 3000, the rod integrators 20 and 30 can produce a uniform optical intensity distribution more efficiently than in the light emitting apparatus 2000.

Figure 10:
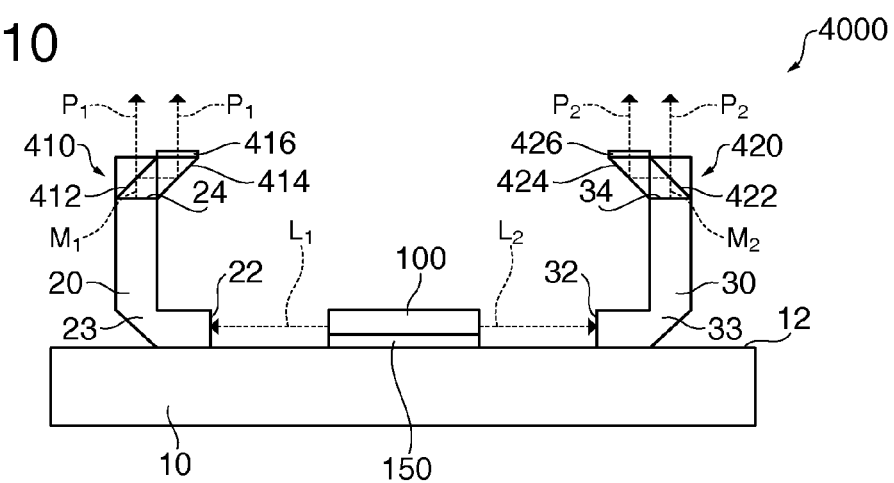
FIG. 10 is a cross-sectional view diagrammatically showing a light emitting apparatus according to a third variation of the embodiment.

3-3. A light emitting apparatus 4000 according to a third variation of the present embodiment will next be described. FIG. 10 is a cross-sectional view diagrammatically showing the light emitting apparatus 4000. In FIG. 10, the light emitting device 100 is shown in a simplified form for ease of illustration.

The light emitting apparatus 4000 includes a first polarization converter 410 and a second polarization converter 420, as shown in FIG. 10. The first polarization converter 410 is disposed somewhere in the optical path of the mixed light flux $M_1$ having exited through the first light exiting surface 24 of the first rod integrator 20. The mixed light flux $M_1$ is incident on the first polarization converter 410. The second polarization converter 420 is disposed somewhere in the optical path of the mixed light flux $M_2$ having exited through the second light exiting surface 34 of the second rod integrator 30. The mixed light flux $M_2$ is incident on the second polarization converter 420. In the illustrated example, the polarization converters 410 and 420 are so disposed that they are in contact with the light exiting surfaces 24 and 34 of the rod integrators 20 and 30.

The first polarization converter 410 includes a first polarizing beam splitter 412, a first mirror 414, and a first half-wave plate 416. The first polarizing beam splitter 412 can transmit a P-polarized component of the mixed light flux $M_1$ and reflect an S-polarized component thereof. The first mirror 414 can reflect again the S-polarized component of the mixed light flux $M_1$ reflected off the first polarizing beam splitter 412 and direct the reflected S-polarized component to the first half-wave plate 416. The first half-wave plate 416 can convert the S-polarized component of the mixed light flux $M_1$ into the P-polarized component. The first polarization converter 410, which includes the first polarizing beam splitter 412, the first mirror 414, and the first half-wave plate 416, converts the S-polarized component of the mixed light flux $M_1$ into the P-polarized component, for example, allows the mixed light flux $M_1$ to be formed of only the P-polarized component. The first polarization converter 410 can thus convert the mixed light flux $M_1$ into a polarized light flux $P_1$.

The second polarization converter 420 includes a second polarizing beam splitter 422, a second mirror 424, and a second half-wave plate 426. The second polarizing beam splitter 422 can transmit the P-polarized component of the mixed light flux $M_2$ and reflect the S-polarized component thereof. The second mirror 424 can reflect again the S-polarized component of the mixed light flux $M_2$ reflected off the second polarizing beam splitter 422 and direct the reflected S-polarized component to the second half-wave plate 426. The second half-wave plate 426 can convert the S-polarized component of the mixed light flux $M_2$ into the P-polarized component. The second polarization converter 420, which includes the second polarizing beam splitter 422, the second mirror 424, and the second half-wave plate 426, converts the S-polarized component of the mixed light flux $M_2$ into the P-polarized component, for example, allows the mixed light $M_2$ to be formed of only the P-polarized component. The second polarization converter 420 can thus convert the mixed light flux $M_2$ into a polarized light flux $P_2$.

In the light emitting apparatus 4000, the first polarization converter 410 can convert the mixed light flux $M_1$ into the polarized light flux $P_1$, and the second polarization converter 420 can convert the mixed light flux $M_2$ into the polarized light flux $P_2$. The polarization converters 410 and 420 can further align the polarization directions of the polarized light flux $P_1$ and the polarized light flux $P_2$ with each other. Therefore, in the light emitting apparatus 4000, an illuminated area can be illuminated with polarized light.

The above description has been made of the case where the polarization converters 410 and 420 convert the S-polarized component of the mixed light fluxes $M_1$ and $M_2$ into the P-polarized component. The polarization converters 410 and 420 may alternatively convert the P-polarized component of the mixed light fluxes $M_1$ and $M_2$ into the S-polarized component.

Figure 11:
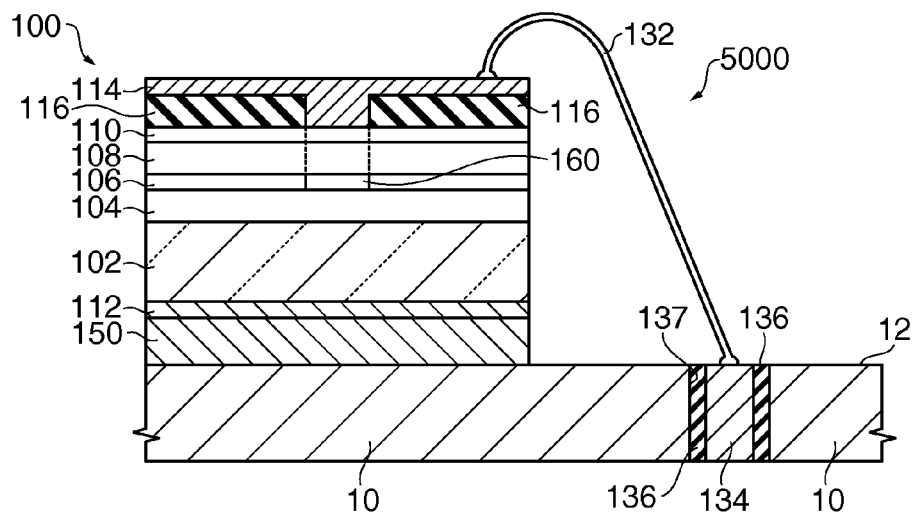
FIG. 11 is a cross-sectional view diagrammatically showing a light emitting apparatus according to a fourth variation of the embodiment.

3-4. A light emitting apparatus 5000 according to a fourth variation of the present embodiment will next be described. FIG. 11 is a cross-sectional view diagrammatically showing the light emitting apparatus 5000.

In the example of the light emitting apparatus 1000, the active layer 106 is disposed on the side close to the support substrate 10 in the light emitting device 100, as shown in FIG. 4. In contrast, in the light emitting apparatus 5000, the active layer 106 is disposed on the side away from the support substrate 10 in the light emitting device 100, as shown in FIG. 11. In the light emitting apparatus 5000, the substrate 102 is disposed between the active layer 106 and the support substrate 10. The second electrode 112 is connected to the submount 150, for example, via connecting members (not shown). The first electrode 114 is connected to the terminal 134, for example, via the connecting member 132.

According to the light emitting apparatus 5000, since the substrate 102 is disposed between the active layer 106 and the support substrate 10, the active layer 106 is further set apart from the support substrate 10 by at least a distance corresponding to the substrate 102, as compared with the light emitting apparatus 1000. It is therefore possible to prevent the amount of light emitted from the gain regions 160 from decreasing before incident on the rod integrators. For example, when the light emitted from each of the gain regions 160 has a large angle of radiation, part of the emitted light is blocked by the support substrate 10 and the amount of light incident on the rod integrators decreases in some cases. The problem will not occur in the light emitting apparatus 5000.

In the light emitting apparatus of the present embodiment as well as in the present variation, the rod integrators 20 and 30 are desirably disposed in positions close to the light emitting surfaces 162 and 164 of the light emitting device 100. The rod integrators are more desirably in contact with the light emitting surfaces of the light emitting device. In this way, the light emitting device is coupled with the rod integrators more efficiently, whereby the light emitting apparatus can use light more efficiently. Further, a reflection film may be formed on the support substrate between the light emitting device 100 and the rod integrators 20, 30 so that light blocked by the substrate is reflected off the reflection film toward the rod integrators.

4. Illuminator

Figure 12:
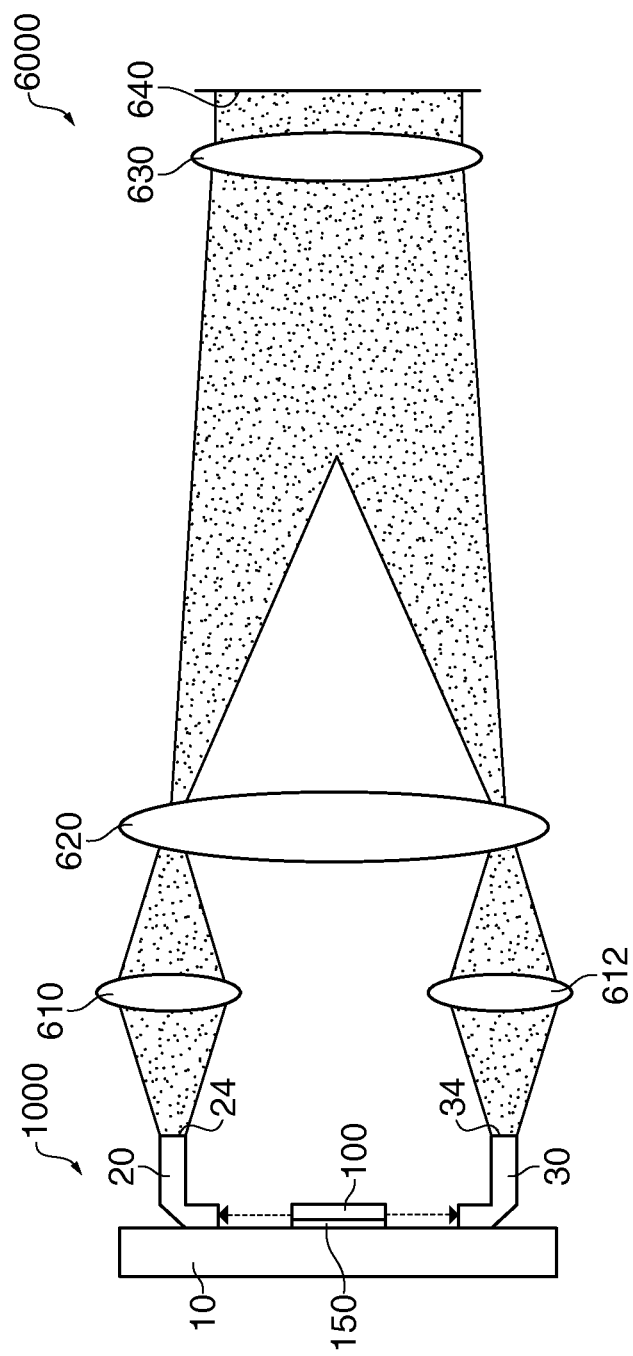
FIG. 12 diagrammatically shows an illuminator according to the embodiment.

An illuminator according to the present embodiment will next be described with reference to the drawings. FIG. 12 diagrammatically shows an illuminator 6000 according to the present embodiment. In the following illuminator according to the present embodiment, members having the same functions as those of the components of the light emitting apparatus 1000 according to the present embodiment have the same reference characters, and no detailed description of those members will be made.

The illuminator 6000 includes the light emitting apparatus 1000, a first lens 610 for causing the light having exited through the first light exiting surface 24 of the first rod integrator 20 to diverge, a second lens 612 for causing the light having exited through the second light exiting surface 34 of the second rod integrator 30 to diverge, a third lens 620 for causing the light having exited through the first lens 610 to be superimposed over the light having exited through the second lens 612, and a fourth lens 630 for causing the light superimposed by the third lens 620 to converge.

The illuminator 6000 includes a light emitting apparatus according to an embodiment of the invention. The following description will be made of a case where the illuminator 6000 includes the light emitting apparatus 1000 as a light emitting apparatus according to an embodiment of the invention.

The first lens 610 causes the light having exited through the first light exiting surface 24 of the first rod integrator 20 to diverge. Specifically, the first lens 610 causes the light having exited through the first light exiting surface 24 to converge first and then diverge. The first lens 610 can cause the light having exited through the first light exiting surface 24 to diverge to a point where the area that the illuminator 6000 can illuminate is enlarged to a desired size (the size of a light incident surface of a light valve, for example). The first lens 610 is, for example, a condenser lens.

In the illustrated example, the first lens 610 is a single lens but may be a combination of a plurality of lenses. The same applies to the lenses 612, 620, and 630, which will be described later.

The second lens 612 causes the light having exited through the second light exiting surface 34 of the second rod integrator 30 to diverge. Specifically, the second lens 612 causes the light having exited through the second light exiting surface 34 to converge first and then diverge. The second lens 612 can cause the light having exited through the second light exiting surface 34 to diverge to a point where the area that the illuminator 6000 can illuminate is enlarged to a desired size (the size of a light incident surface of a light valve, for example). The second lens 612 is, for example, a condenser lens.

The third lens 620 causes the light having exited through the first lens 610 to be superimposed over the light having exited through the second lens 612. The light having exited through the first lens 610 is superimposed over the light having exited through the second lens 612 by the third lens 620, and the resultant light is incident on the fourth lens 630.

The fourth lens 630 causes the light superimposed by the third lens 620 to converge. In the illustrated example, the fourth lens 630 causes the light superimposed by the third lens 620 to converge in an illuminated area (a light incident surface of a light valve, for example) 640. That is, the light superimposed by the third lens 620 converges after passing through the fourth lens 630 and illuminates the illuminated area 640.

The illuminator 6000, which includes the light emitting apparatus 1000, can produce a uniform optical intensity distribution in the illuminated area 640.

In the illuminator 6000, since the third lens 620 can superimpose the light fluxes having exited through the two light exiting surfaces 24 and 34 over each other, the optical intensity distribution in the illuminated area 640 can be more uniform. For example, when the intensity of the light having exited through the first light exiting surface 24 differs from that of the light having exited through the second light exiting surface 34, and the illuminated area 640 is illuminated with the light having exited through the first light exiting surface 24 and the light having exited through the second light exiting surface 34 that have not undergone any superposition, the optical intensity distribution in the illuminated area 640 reflects the difference in intensity. The problem will not occur in the illuminator 6000.

5. Projector

Figure 13:
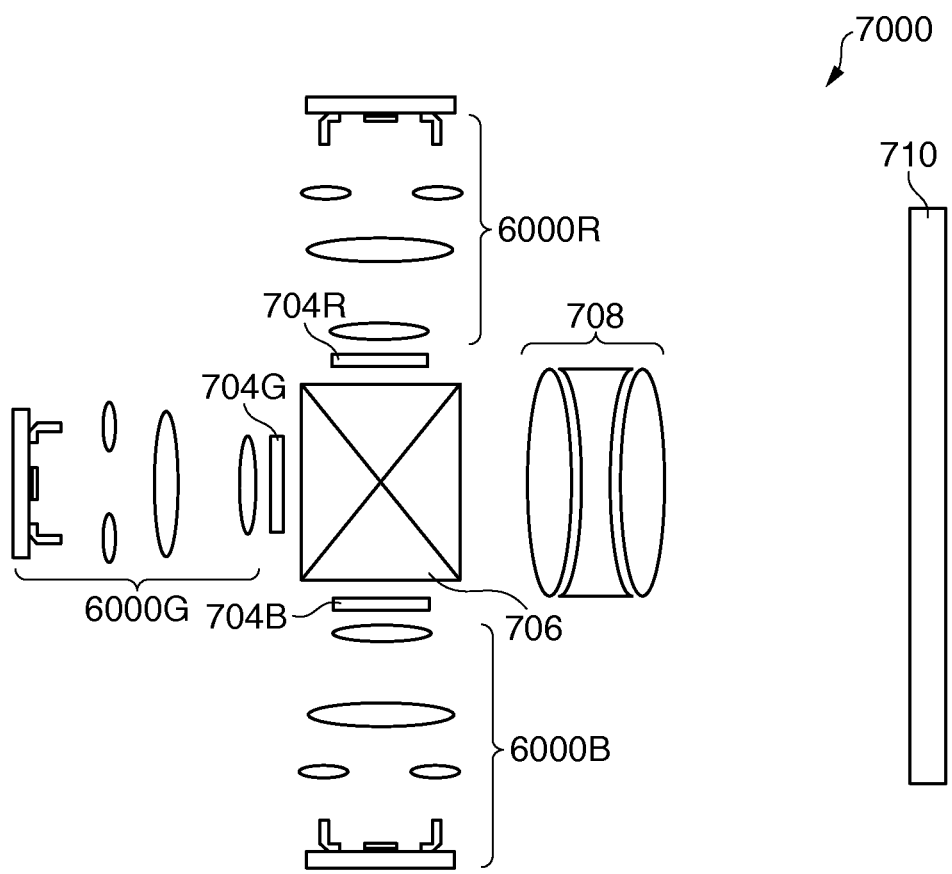
FIG. 13 diagrammatically shows a projector according to the embodiment.

A projector 7000 according to the present embodiment will be next described with reference to the drawings. FIG. 13 diagrammatically shows the projector 7000. In FIG. 13, an enclosure that is part of the projector 7000 is omitted for ease of illustration.

In the projector 7000, a red light source (illuminator) 6000R that emits red light, a green light source (illuminator) 6000G that emits green light, and a blue light source (illuminator) 6000B that emits blue light are illuminators according to an embodiment of the invention (illuminator 6000, for example).

The projector 7000 includes transmissive liquid crystal light valves (light modulation apparatus) 704R, 704G, and 704B that modulate light beams emitted from the light sources 6000R, 6000G, and 6000B in accordance with image information and a projection lens (projection apparatus) 708 that enlarges images formed by the liquid crystal light valves 704R, 704G, and 704B and projects the enlarged images on a screen (displayed surface) 710. The projector 7000 can further include a cross dichroic prism (light combiner) 706 that combines light fluxes outputted from the liquid crystal light valves 704R, 704G, and 704B and guides the combined light to the projection lens 708.

The three color light fluxes modulated by the liquid crystal light valves 704R, 704G, and 704B are incident on the cross dichroic prism 706. The prism is formed by bonding four rectangular prisms and thus has internal surfaces that intersect each other in an X-like shape. One of the internal surfaces has a dielectric multilayer film that reflects red light, and the other internal surface has a dielectric multilayer film that reflects blue light. The dielectric multilayer films combine the three color light fluxes to form light representing a color image. The projection lens 708, which is a projection system, projects the combined light on the screen 710 and displays an enlarged image.

As described above, the projector 7000 can use the illuminator 6000, which can produce a uniform optical intensity distribution in an illuminated area, as a light source. The projector 7000 can therefore project an image having only a small amount of illuminance unevenness.

In the example described above, transmissive liquid crystal light valves are used as the light modulation apparatus. Alternatively, any light valve that does not use a liquid crystal material or a reflective light valve may be used. Examples of the alternative light valve may include a reflective liquid crystal light valve and a digital micromirror device. The configuration of the projection system is changed as appropriate in accordance with the type of a light valve to be used.

The embodiment and the variations described above have been presented by way of example, and the invention is not limited thereto. For example, any of the embodiment and the variations can be combined as appropriate.

The embodiment of the invention has been described in detail, and the skilled in the art will readily understand that many changes can be made to the extent that they do not substantially depart from the novel features and advantageous effects of the invention. All such variations are therefore intended to fall within the scope of the invention.

What is claimed is:

1. A light emitting apparatus comprising:
a first rod integrator and a second rod integrator; and
a light emitting device disposed between the first rod integrator and the second rod integrator,
wherein the light emitting device emits first light and second light to be incident on the first rod integrator, and third light and fourth light to be incident on the second rod integrator,
the first rod integrator has:
a first light incident surface on which the first light and the second light are incident,
a first bent portion that changes the propagating direction of the first light and the second light, and
a first light exiting surface through which the first light and the second light exit toward a predetermined area, and
the second rod integrator has:
a second light incident surface on which the third light and the fourth light are incident,
a second bent portion that changes the propagating direction of the third light and the fourth light, and
a second light exiting surface through which the third light and the fourth light exit toward the predetermined area.

2. The light emitting apparatus according to claim 1, further comprising:
a first cylindrical lens disposed in the optical paths of the first light and the second light; and
a second cylindrical lens disposed in the optical paths of the third light and the fourth light.

3. The light emitting apparatus according to claim 1, further comprising:
a first cylindrical lens disposed in the optical path of the light having exited through the first light exiting surface; and
a second cylindrical lens disposed in the optical path of the light having exited through the second light exiting surface.

4. The light emitting apparatus according to claim 1, further comprising:
a first polarization converter that converts the light having exited through the first light exiting surface into first polarized light; and
a second polarization converter that converts the light having exited through the second light exiting surface into second polarized light,
wherein the first polarized light and the second polarized light are polarized in the same direction.

5. The light emitting apparatus according to claim 1, wherein the light emitting device is a super luminescent diode.

6. The light emitting apparatus according to claim 1, wherein the first light exiting surface and the second light exiting surface are oriented in the same direction.

7. An illuminator comprising:
the light emitting apparatus according to claim 1;
a first lens that causes the light having exited through the first light exiting surface of the first rod integrator in the light emitting apparatus to diverge;
a second lens that causes the light having exited through the second light exiting surface of the second rod integrator in the light emitting apparatus to diverge;

a third lens that superimposes the light having exited through the first lens over the light having exited through the second lens; and a fourth lens that causes the light superimposed by the third lens to converge.

8. A projector comprising:

the illuminator according to claim 7;

a light modulation apparatus that modulates the light having exited from the illuminator in accordance with image information; and a projection apparatus that projects an image formed by the light modulation apparatus.

* * * * *